(12) United States Patent
Shiokawa et al.

(10) Patent No.: US 10,276,883 B2
(45) Date of Patent: Apr. 30, 2019

(54) FUEL CELL SYSTEM AND DRYNESS DEGREE ACQUISITION METHOD

(71) Applicant: TOYOTA JIDOSHA KABUSHIKI KAISHA, Toyota-shi, Aichi-ken (JP)

(72) Inventors: Satoshi Shiokawa, Okazaki (JP); Tetsuya Bono, Miyoshi (JP); Osamu Hamanoi, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 228 days.

(21) Appl. No.: 14/920,064

(22) Filed: Oct. 22, 2015

(65) Prior Publication Data

US 2016/0141688 A1   May 19, 2016

(30) Foreign Application Priority Data

Nov. 15, 2014  (JP) ................. 2014-232248

(51) Int. Cl.
| | |
|---|---|
| *H01M 8/04* | (2016.01) |
| *H01M 8/04828* | (2016.01) |
| *G01R 31/36* | (2019.01) |
| *H01M 8/04119* | (2016.01) |
| *H01M 8/0432* | (2016.01) |
| *H01M 8/04492* | (2016.01) |
| *H01M 8/04537* | (2016.01) |
| *H01M 8/04664* | (2016.01) |
| *H01M 8/1018* | (2016.01) |

(52) U.S. Cl.
CPC .... *H01M 8/04828* (2013.01); *G01R 31/3662* (2013.01); *G01R 31/3679* (2013.01); *H01M 8/0485* (2013.01); *H01M 8/04126* (2013.01); *H01M 8/04358* (2013.01); *H01M 8/04492* (2013.01); *H01M 8/04529* (2013.01); *H01M 8/04634* (2013.01); *H01M 8/04664* (2013.01); *H01M 2008/1095* (2013.01)

(58) Field of Classification Search
None
See application file for complete search history.

(56) References Cited

U.S. PATENT DOCUMENTS

| | | | |
|---|---|---|---|
| 2006/0115699 A1* | 6/2006 | Matsuoka | H01M 8/04007 429/414 |
| 2007/0072016 A1 | 3/2007 | St. Pierre et al. | |
| 2009/0169934 A1* | 7/2009 | Manabe | G01R 31/3662 429/430 |

(Continued)

FOREIGN PATENT DOCUMENTS

| | | |
|---|---|---|
| CN | 101213696 A | 7/2008 |
| JP | 2008-277089 A | 11/2008 |

(Continued)

*Primary Examiner* — Lucas J. O'Donnell
(74) *Attorney, Agent, or Firm* — Finnegan, Henderson, Farabow, Garrett & Dunner, LLP

(57) ABSTRACT

A fuel cell system, comprising: a measurer that measures an impedance of the fuel cell; a controller that controls an operation state of the fuel cell; and an acquirer that acquires a dryness degree of the fuel cell from the measured impedance when the operation state is a first operation state, and acquires the dryness degree of the fuel cell as a wet state when the operation state is a second operation state in which a water balance is more than the first operation state.

5 Claims, 7 Drawing Sheets

(56) References Cited

U.S. PATENT DOCUMENTS

2010/0141262 A1* 6/2010 Watanabe .......... H01M 8/04119
                                                      324/430
2010/0280939 A1   11/2010 Oh et al.
2010/0291446 A1   11/2010 Aso et al.
2011/0269046 A1   11/2011 Suematsu

FOREIGN PATENT DOCUMENTS

| | | |
|---|---|---|
| JP | 2008-282674 | 11/2008 |
| JP | 2009-231225 | 10/2009 |
| JP | 2010-165463 | 7/2010 |
| KR | 10-2010-0121354 A | 11/2010 |

* cited by examiner

FUEL CELL SYSTEM AND DRYNESS DEGREE ACQUISITION METHOD

CROSS-REFERENCE TO RELATED APPLICATIONS

The present application claims the priority based on the Japanese Patent Application Publication No. 2014-232248 filed on Nov. 15, 2014, the disclosure of which is incorporated by reference herein in its entirety.

BACKGROUND

Field

The present invention relates to a fuel cell.

Related Art

There is known a technique by which it is detected on the basis of an impedance of a fuel cell that whether or not an electrolyte membrane configuring the fuel cell is dry. Specifically, it is detected that if the impedance is below a reference value, the electrolyte membrane is wet, and if the impedance is equal to or above the reference value, the electrolyte membrane is dry (JP2009-231225).

SUMMARY

In the case of the above-described prior art, if the impedance of the fuel cell changes due to a reason other than dryness of the electrolyte membrane, there is a risk of misdetection. The present aspect aims at providing a solution for preventing such a misdetection.

The present aspect aims to resolve the above-described problem, and may be implemented in the forms described below.

According to a form of the present aspect, a fuel cell system described below is provided. The fuel cell system includes a measurer that measures an impedance of the fuel cell; a controller that controls an operation state of the fuel cell; and an acquirer that acquires a dryness degree of the fuel cell from the measured impedance when the operation state is a first operation state, and acquires the dryness degree of the fuel cell as a wet state when the operation state is a second operation state in which a water balance is more than the first operation state. According to the present form, misdetection in the operation state with more water balance may be prevented. This is because in the operation state with more water balance, the dryness detection based on the impedance is stopped. The possibility of occurrence of a misdetection during dryness detection based on impedance is high in the operation state with more water balance.

The acquirer acquires the dryness degree as a wet state when the real part of the impedance is smaller than the reference value, and also acquires the real part on the basis of measurement by the measurer when the operation state is the first operation state, and the real part may be considered to be a value that is smaller than the reference value when the operation state is the second operation state. According to the present form, the same reference value may be used in the first and the second operation states.

According to another form of the present aspect, a fuel cell system described below is provided. The fuel cell system includes a measurer that measures an impedance of the fuel cell; a controller that controls an operation state of the fuel cell; and an acquirer that acquires a dryness degree of the fuel cell from the measured impedance when the operation state is a first operation state, and acquires the dryness degree of the fuel cell from the impedance measured by the measurer during the first operation state when the operation state is a second operation state in which a water balance is more than the first operation state. According to the present form, misdetection in the operation state with more water balance may be prevented. This is because in the operation state in which the water balance is more, dryness detection is performed by using the impedance measured during the operation state in which the water balance is less.

The second operation state may be a state in which operation is performed when the temperature of the fuel cell is less than a predetermined value. According to the present form, the existence of the first operation state or the second operation state may be decided in a stable manner.

The measurer may measure the impedance using a single frequency. According to the present form, the impedance may be measured easily.

When it is acquired, by the acquirer, that the dryness degree is the dry state, the controller may perform the humidification operation in which the water balance is more than the first operation state. According to the present form, the dryness of the fuel cell may be controlled.

The present aspect may be implemented in various forms other than the above. For example, the present aspect may be implemented in the form of an operating method of a fuel cell, a computer program for implementing such a method, a non-transitory storage medium in which such a computer program is stored, a dryness degree acquisition apparatus in which such a computer program is executed, and a dryness control apparatus in which such a computer program is executed.

DESCRIPTION OF THE EMBODIMENTS

Figure 1:
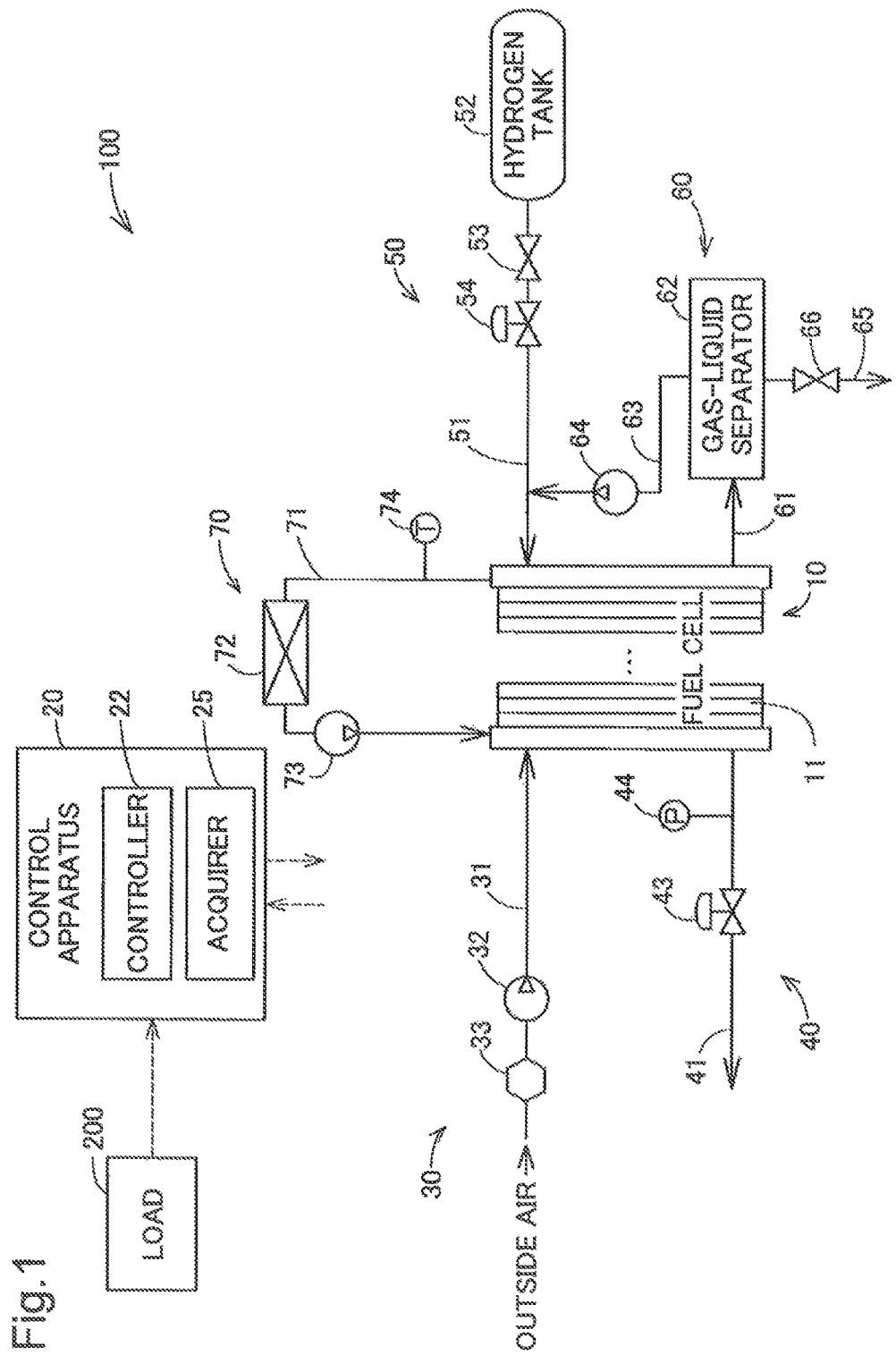
FIG. 1 is a schematic diagram showing a configuration of a fuel cell system.

A first embodiment is described below. FIG. 1 is a schematic diagram showing a configuration of a fuel cell system 100. The fuel cell system 100 includes a fuel cell 10, a control apparatus 20, a cathode gas supply portion 30, a cathode gas discharge portion 40, an anode gas supply portion 50, an anode gas circulation and discharge portion 60, and a cooling medium supply portion 70.

The fuel cell 10 is a polymer electrolyte fuel cell that generates power by receiving a supply of hydrogen (anode gas) and air (cathode gas) as the reaction gas. The fuel cell 10 has a stacked structure in which a plurality of unit cells 11 are stacked. Each cell 11 has a membrane electrode assembly that is a power generator in which electrodes are arranged on both surfaces of an electrolyte membrane, and two separators that sandwich the membrane electrode assembly.

The electrolyte membrane is configured by a solid polymer thin film showing excellent proton conductivity when the dryness degree is the wet state. It must be noted that in the present embodiment, the dryness degree is an index that is decided either as a wet state or a dry state. The wet state is a state in which excellent proton conductivity, as described above, is seen, and which does not hinder the operation of the fuel cell 10. The dry state is a state that is not the wet state, that is, a state in which proton conductivity is not good, and which hinders the operation of the fuel cell 10. The electrodes are configured by carbon. A platinum catalyst for promoting the power generation reaction is carried in the boundary surface of the electrode and the electrolyte membrane. A manifold (not shown in the drawing) for the reaction gas and cooling medium is provided in each cell 11. The reaction gas of the manifold is supplied to the power generation area of each cell 11 through the gas flow path provided in each cell 11.

The control apparatus 20 includes a controller 22 and an acquirer 25. The controller 22 receives a power generation request from the load 200, controls each of the below-described configuring portions of the fuel cell system 100 according to the request, and generates power from the fuel cell 10.

The cathode gas supply portion 30 includes a cathode gas pipe 31, an air compressor 32, and an air flowmeter 33. The cathode gas pipe 31 is a pipe that is connected to the cathode side of the fuel cell 10. The air compressor 32 is connected to the fuel cell 10 via the cathode gas pipe 31, and supplies the air that is compressed by incorporating the outside air to the fuel cell 10 as cathode gas.

The air flowmeter 33 measures the amount of outside air incorporated by the air compressor 32 at the upstream side of the air compressor 32, and sends the measured value to the controller 20. By driving the air compressor 32 on the basis of the measured value, the control apparatus 20 controls the amount of supply of air to the fuel cell 10 by correlating it with the application of generated power to the load 200, or by controlling it separately from application of power.

The cathode gas discharge portion 40 includes a cathode discharge gas pipe 41, a pressure-regulating valve 43, and a pressure measurer 44. The cathode discharge gas pipe 41 is a pipe that is connected to the cathode side of the fuel cell 10, and discharges the cathode discharge gas to the outside of the fuel cell system 100. The pressure-regulating valve 43 adjusts the pressure of the cathode discharge gas (back pressure of the fuel cell 10) in the cathode discharge gas pipe 41. The pressure measurer 44 is provided at the upstream side of the pressure-regulating valve 43, measures the pressure of the cathode discharge gas, and sends the measured value to the controller 20. The controller 20 adjusts the opening of the pressure-regulating valve 43 on the basis of the measured value of the pressure measurer 44.

The anode gas supply portion 50 includes an anode gas pipe 51, a hydrogen tank 52, a shut-off valve 53, and a regulator 54. The hydrogen tank 52 is connected to the anode of the fuel cell 10 via the anode gas pipe 51, and supplies the hydrogen filled inside the tank to the fuel cell 10.

The shut-off valve 53 and the regulator 54 are provided in the anode gas pipe 51 from the upstream side (that is, the side close to the hydrogen tank 52), in this order. The shut-off valve 53 opens and closes according to an instruction from the control apparatus 20, and controls the inflow of hydrogen from the hydrogen tank 52. The regulator 54 is a pressure-reducing valve for adjusting the pressure of hydrogen, and the opening thereof is controlled by the control apparatus 20.

The anode gas circulation and discharge portion 60 includes an anode discharge gas pipe 61, a gas-liquid separator 62, an anode gas circulation pipe 63, a hydrogen circulation pump 64, an anode discharge water pipe 65, and a drain valve 66. The anode discharge gas pipe 61 is a pipe that connects the outlet of the anode of the fuel cell 10 and the gas-liquid separator 62, and channels the anode discharge gas containing the un-reacted gas (such as hydrogen and nitrogen) that was not used in the power generation reaction to the gas-liquid separator 62.

The gas-liquid separator 62 is connected to the anode gas circulation pipe 63, and the anode discharge water pipe 65. The gas-liquid separator 62 separates the gas component and the water component included in the anode discharge gas, channels the gas component into the anode gas circulation pipe 63, and the water component into the anode discharge water pipe 65.

The anode gas circulation pipe 63 is connected to the anode gas pipe 51. The hydrogen circulation pump 64 is provided in the anode gas circulation pipe 63, and the hydrogen included in the gas component separated in the gas-liquid separator 62 is fed to the anode gas pipe 51 by the hydrogen circulation pump 64. Thus, in the fuel cell system 100, the usage efficiency of hydrogen is improved by circulating the hydrogen included in the anode discharge gas and again supplying it to the fuel cell 10.

The anode discharge water pipe 65 is a pipe for discharging the moisture content separated in the gas-liquid separator 62 to the outside of the fuel cell system 100. The drain valve 66 is provided in the anode discharge water pipe 65, and opens and closes according to an instruction from the control apparatus 20. During the operation of the fuel cell system 100, the control apparatus 20 normally keeps the drain valve 66 closed, and opens the drain valve 66 at a predetermined discharge water timing that has already been set, or the discharge timing of the inert gas present in the anode discharge gas.

The cooling medium supply portion 70 includes a cooling medium pipe 71, a radiator 72, a cooling medium circulation pump 73, and a cooling medium temperature measurer 74. The cooling medium pipe 71 is a pipe that links the inlet manifold and the outlet manifold for the cooling medium that are provided in the fuel cell 10, and circulates the cooling medium for cooling the fuel cell 10. The radiator 72 is provided in the cooling medium pipe 71, and cools the cooling medium through heat exchange between the cooling medium circulating through the cooling pipe 71 and the outside air.

The cooling medium circulation pump 73 is provided at the downstream side (the cooling medium inlet side of the fuel cell 10) from the radiator 72 in the cooling medium pipe 71, and feeds the cooling medium cooled in the radiator 72 to the fuel cell 10. The cooling medium temperature measurer 74 is provided near the cooling medium outlet of the fuel cell 10 in the cooling medium pipe 71, and sends the measured value to the control apparatus 20. The control apparatus detect the operating temperature of the fuel cell 10 from the measured value of the cooling medium temperature measurer 74. By controlling the radiator 72 and the cooling medium circulation pump 73 based on the detection result, the control apparatus 20 adjusts the temperature of the fuel cell 10.

Figure 2:
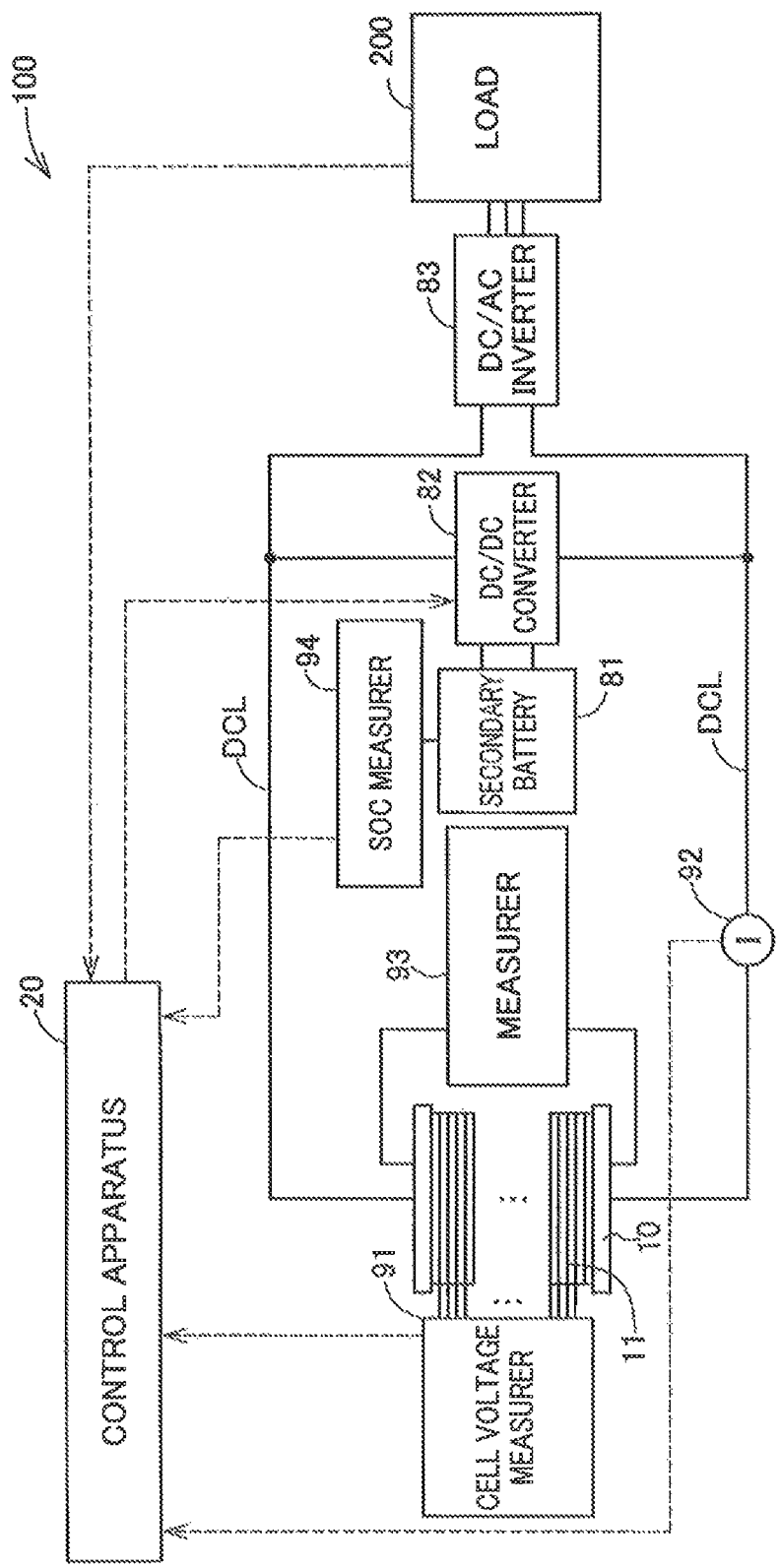
FIG. 2 is a schematic diagram showing an electrical configuration of a fuel cell system.

FIG. 2 is a schematic diagram showing an electrical configuration of the fuel cell system 100. The fuel cell system 100 includes a secondary battery 81 a DC/DC converter 82, a DC/AC inverter 83, a cell voltage measurer 91, a current measurer 92, a measurer 93, and an SOC measurer 94.

The fuel cell 10 is connected to the DC/AC inverter 83 via a DC power line DCL. The secondary battery 81 is connected to the DC power line DCL via the DC/DC converter 82. The DC/AC inverter 83 is connected to the load 200.

The secondary battery 81 is configured by a lithium ion battery, and functions as an auxiliary power supply of the fuel cell. The DC/DC converter 82 controls the charging and discharging of the secondary battery 81, and adjusts the voltage level of the DC power line DCL in accordance with an instruction from the control apparatus 20. If the output of the fuel cell 10 is insufficient with respect to the output request from the load 200, the control apparatus instructs the supply of power from the secondary battery 81 via the DC/DC converter 82.

The DC/AC inverter 83 converts the DC power obtained from the fuel cell 10 and the secondary battery 81 to AC power, and supplies it to the load 200. If regenerative electric power is generated in the load 200, the regenerative electric power is converted to DC power by the DC/AC inverter 83, and is used for charging the secondary battery 81 via the DC/DC converter 82.

The cell voltage measurer 91 is connected to each cell 11 of the fuel cell 10, and measures the voltage of each cell 11 (cell voltage). The cell voltage measurer 91 sends the measurement result to the control apparatus 20.

The current measurer 92 is connected to the DC power line DCL, measures the current value output by the fuel cell 10, and sends it to the control apparatus 20. The SOC measurer 94 is connected to the secondary battery 81, measures the SOC (State Of Charge) of the secondary battery 81, and sends it to the control apparatus 20.

The measurer 93 measures the impedance of the fuel cell 10 with an alternating current method. The impedance of the fuel cell 10 changes depending on the amount of moisture that exists inside the fuel cell 10. Therefore, it may be estimated whether the dryness degree of the electrolyte membrane is the dry state or the wet state by measuring the impedance. The specific estimation method is explained hereafter.

Figure 3:
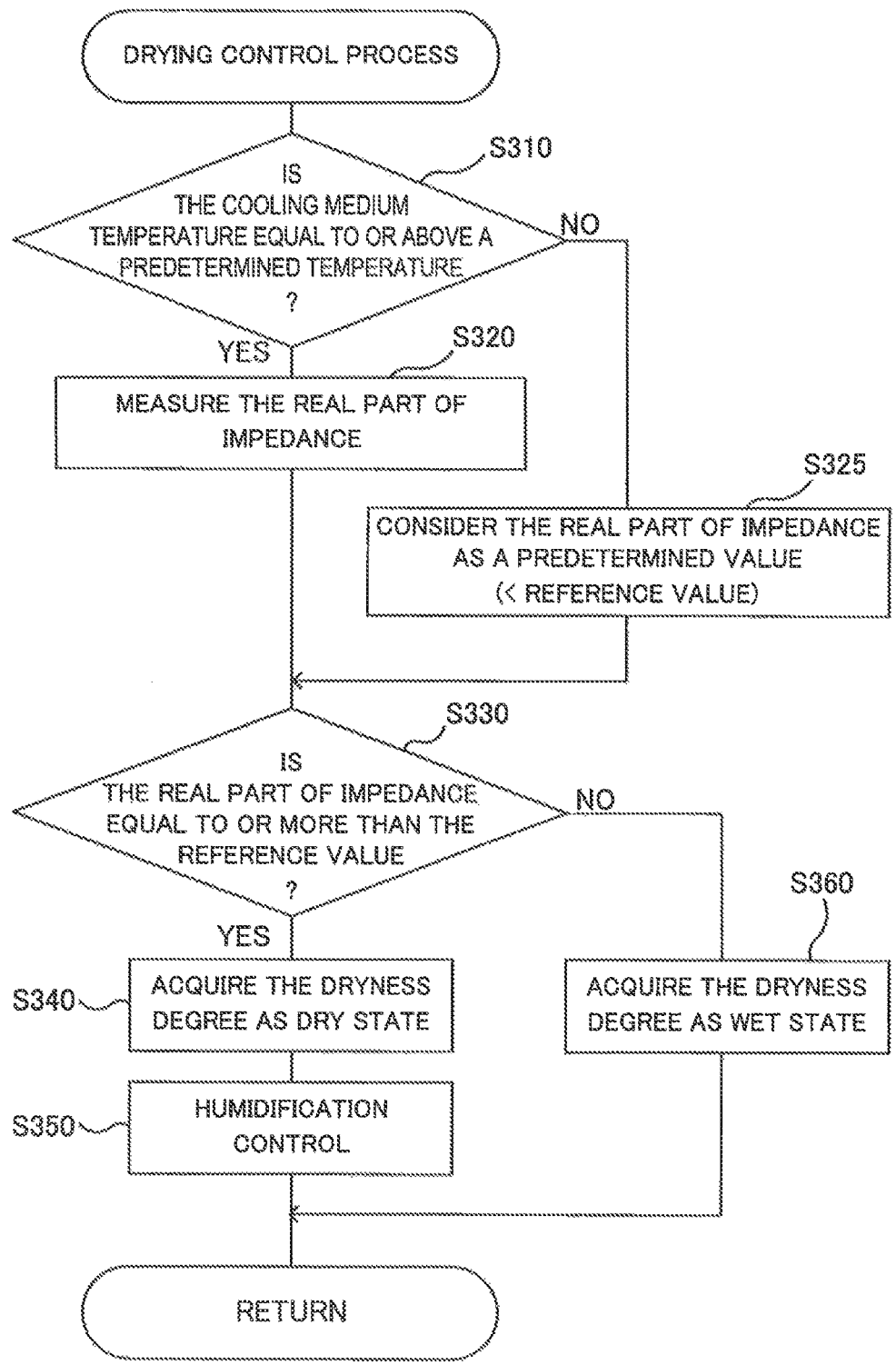
FIG. 3 is a flowchart showing a dryness control process (first embodiment).

FIG. 3 is a flowchart showing a dryness control process. The dryness control process is repeatedly executed by the control apparatus 20 during the time period when power is generated by the fuel cell 10. The control apparatus 20 functions as a dryness control apparatus in which a dryness control method is implemented through the execution of the dryness control process. The control apparatus 20 also functions as a dryness degree acquisition apparatus by implementing the dryness degree acquisition process through the execution of the dryness control process.

First of all, it is determined if the cooling medium temperature is equal to or above a predetermined temperature T (for example 50° C.) (step S310). If the cooling medium temperature is equal to or above the predetermined temperature T (step S310, YES), the real part R1 of impedance is measured (step S320). Hereinafter, the "real part of impedance" is simply called the "real part".

Figure 4:
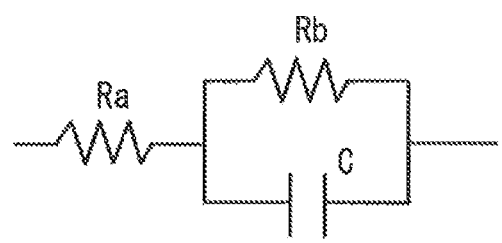
FIG. 4 is a circuit diagram showing an equivalent circuit of a fuel cell.

FIG. 4 shows an equivalent circuit during the above-described impedance measurement. In FIG. 4, Ra indicates the solution resistance, Rb indicates the reaction resistance, and C indicates the capacity in the electrical double layer capacitor. The solution resistance Ra increases when the above-described electrolyte membrane dries. That is, the dryness of the electrolyte membrane may be detected by monitoring the solution resistance Ra.

Figure 5:
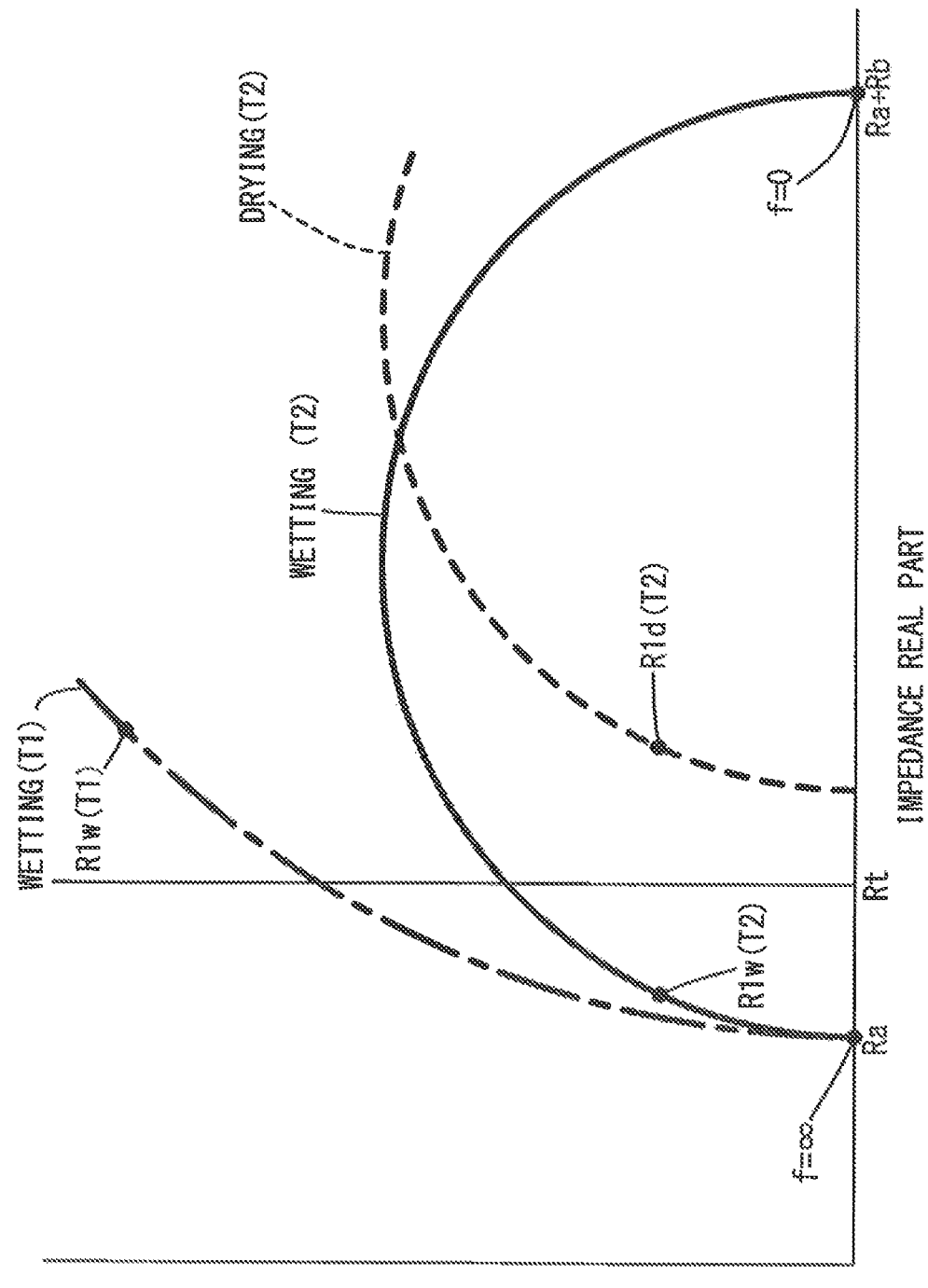
FIG. 5 is a diagram showing a Cole-Cole plot in an equivalent circuit.

FIG. 5 is a diagram showing a Cole-Cole plot in an equivalent circuit. Theoretically, the real part in the case when the frequency f is infinitely large is equal to the solution resistance Ra. In the present embodiment, the frequency f is fixed at a relatively small predetermined value (for example, any value between 200 and 240 Hz), and the real part R1 thus obtained is considered as the solution resistance Ra.

Next, it is determined if the real part R1 is equal to or above the reference value Rt (step S330). If the real part is equal to or above the reference value Rt (step S330, YES), the acquirer 25 acquires the dryness degree as the dry state (step S340). That is, when the real part R1 is equal to or above the reference value Rt, the acquirer 25 detects that the electrolyte membrane is in the dry state. When the cooling medium temperature is T2. FIG. 5 illustrates the real part R1$d$ (T2) as the value if the electrolyte membrane is dry. Temperature T2 is a higher temperature than the predetermined temperature T, for example, 80° C.

Following this, after executing humidification control (step S350), the controller 22 ends the dryness control process. Specifically, humidification control may be performed by reducing the temperature of the fuel cell, reducing the stoichiometric ratio of at least one of the cathode gas and the anode gas, or closing the drain valve 66. In step S350, either of the two may be executed, or two or more may be executed simultaneously.

On the other hand, if the real part R1 is below the reference value Rt (step S330, NO), the dryness control process is ended after the acquirer 25 acquires the dryness degree as the wet state (step S360). That is, if the real part R1 is below the reference value Rt, the control apparatus 20 ends the dryness control process without executing humidification control by the controller 20. This is because the probability of the electrolyte membrane being wet is high if the real part R1 is below the reference value Rt. That is, the reason why humidification control is not performed when the real part R1 is below the reference value Rt is because it is actually detected that the dryness degree is the wet state. When the cooling medium temperature is T2, FIG. 5 illustrates the real part R1$w$ (T2) as the value if the electrolyte membrane is wet.

On the other hand, when the cooling medium temperature is below a predetermined temperature T (step S310, NO), the real part of impedance is considered to be the predetermined value decided beforehand (step S325), and step S330 is executed. The predetermined value is smaller than the reference value Rt. Thus, when step S325 is executed, it is determined that the real part of impedance is below the reference value Rt (step S330, NO). That is, regardless of the real part of the actual impedance, it is immediately determined that the dryness degree of the electrolyte membrane is the wet state since the cooling medium temperature is below the predetermined temperature T.

Thus, there are two reasons for avoiding dryness detection when the cooling medium temperature is below the predetermined temperature T. The first reason is that if the cooling medium temperature is low, the saturated moisture vapor content becomes less, because of which the probability of the electrolyte membrane being wet is high. If the probability of the electrolyte membrane being wet is high, the need of executing dryness detection is low.

The second reason is due to the possible occurrence of misdetection. As described earlier, since the frequency f is a relatively small value, the real part R1 depends not only on whether the electrolyte membrane is wet or dry, but also strongly depends on the cooling medium temperature. This reason is explained hereafter.

If the cooling medium temperature is low, the temperature of the fuel cell too becomes low. If the temperature of the fuel cell becomes low and is below a certain temperature (a temperature that is almost same as the predetermined temperature T), the water balance becomes large making the moisture content inside the fuel cell reach an excessive value, because of which condensate water tends to occur. Due to the occurrence of condensate water, the gas diffusion resistance increases. The increase in the gas diffusion resistance affects the impedance measurement as an increase in the resistance Rb in the equivalent circuit.

The increases in the resistance Rb is expressed as an increase in the radius of the semi-circle in the Cole-Cole plot. If the radius of the semi-circle increases, it results in an increase in the value of the real part R1 even if the frequency f is the same. FIG. 5 shows a part of the semi-circle for a wet electrolyte membrane when the cooling medium temperature is temperature T1. Temperature T1 is a lower temperature than the predetermined temperature T, for example, 30° C. As shown in FIG. 5, when the cooling medium temperature is T1, the real part R1$w$ (T1) that is measured according to the frequency f exceeds the reference value Rt.

Figure 6:
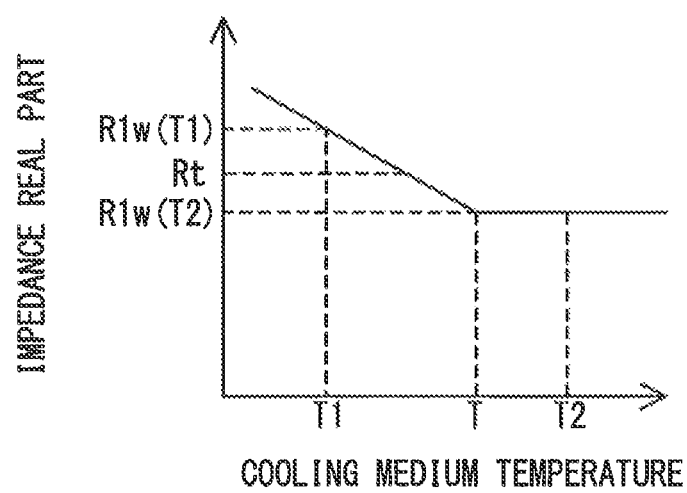
FIG. 6 is a graph showing a schematic relationship between the impedance real part and the cooling medium temperature.

FIG. 6 is a graph showing a schematic relationship between the real part R1 and the cooling medium temperature. This graph shows a relationship based on the assumption that the electrolyte membrane is wet, and the frequency during impedance measurement is fixed. When the cooling medium temperature is equal to or above the predetermined temperature T, then as shown in FIG. 6, the real part R1 becomes stable at the real part R1$w$ (T2). On the other hand, if the cooling medium temperature is less than the predetermined temperature T, then as shown in FIG. 6, the real part R1 becomes large as the cooling medium temperature becomes less, and soon exceeds the reference value Rt and reaches the real part R1$w$ (T1).

In the above-described step S310, the temperature of the fuel cell is monitored as a parameter for determining whether or not the series of events occurs.

According to the present embodiment, even if a concise technique is used for dryness detection, the above-described misdetection may be prevented. The concise technique mentioned here mainly implies the following three points: (a) Adopting a relatively small frequency f in the measurement based on the alternating current method, (b) Fixing the frequency f to a single value, (c) Ignoring the imaginary part of the measured impedance, and detecting the dryness of the electrolyte membrane based on the real part alone. If such a concise technique is used, the manufacturing cost of the fuel cell 10 may be reduced, and the processing load of the control apparatus 20 may also be reduced.

If the above-described (a), (b), and (c) are thus adopted simultaneously, it becomes difficult to determine whether the increase in the real part R1 depends on the increase in the solution resistance Ra or the increase in the reaction resistance Rb. As a result, the conventional methods posed the risk of misdetection.

Thus, according to the present embodiment, misdetection is avoided by stopping dryness detection when the possibility of dependence of the increase in the real part R1 on the increase in the reaction resistance Rb is high. Moreover, even if detection is thus stopped, the possibility of missing out the fact that the electrolyte membrane is dry is low. This is because the condition for stopping detection in order to prevent misdetection (the cooling medium temperature must be below the predetermined temperature T) is also the condition when the possibility of the electrolyte membrane being wet is high.

In addition, the existence of the operation state in which the possibility of dependence of the increase in the real part R1 on the increase in the reaction resistance Rb is high is determined on the basis of the cooling medium temperature alone (step S310), and therefore, the judgment result is stable.

Furthermore, measurement of the cooling medium temperature is more responsive than measurement of impedance, and is preferred as a parameter for stopping the measurement of impedance.

Also, since the same steps are followed after step S330 whether the cooling medium temperature is equal to or above the predetermined temperature T, or is below the predetermined temperature T, the present invention may be implemented through a simple configuration.

A second embodiment is described below. While the second embodiment has the same hardware configuration as the first embodiment, the dryness control process is somewhat different.

Figure 7:
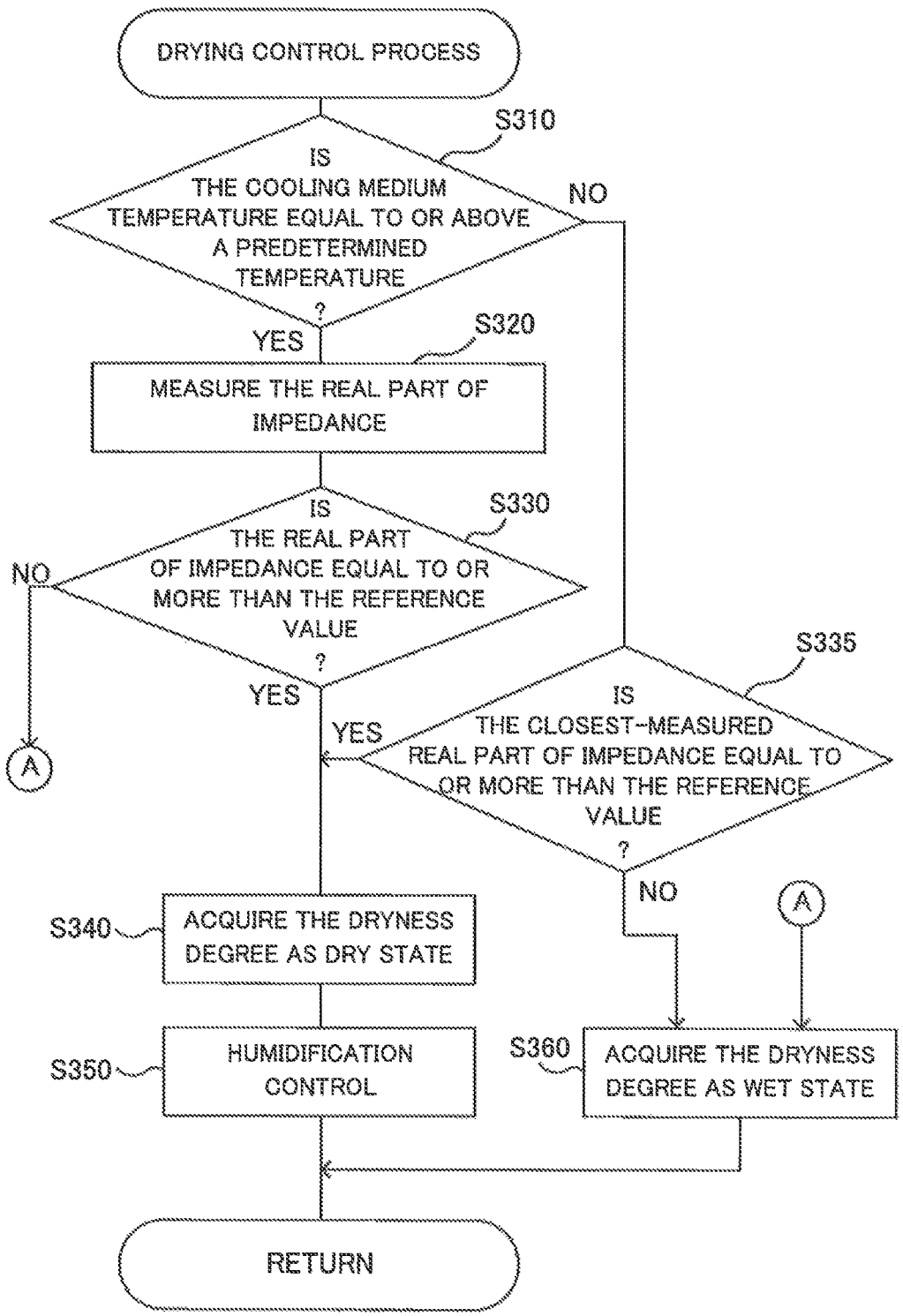
FIG. 7 is a flowchart showing a dryness control process (second embodiment).

FIG. 7 is a flowchart showing a dryness control process according to the second embodiment. The dryness control process according to the second embodiment includes step S335 in place of step S325 included in the first embodiment. The other steps are the same as the first embodiment.

Step S335 is executed when NO is determined in step S310. Specifically, when the cooling medium temperature is below the predetermined temperature T (step S310, NO), it is determined if the nearest-measured real part R1 is equal to or above the reference value Rt (step S335). If the closest-measured real part R1 is equal to or above the reference value Rt (step S335, YES), the dryness control process is ended after the acquirer 25 acquires the dryness degree as the dry state (step S340), and the controller 22 executes humidification control (step S350).

On the other hand, if the closest-measured real part R1 is below the reference value Rt (step S335, NO), the dryness control process is ended after the acquirer 25 acquires the dryness degree as the wet state (step S360), and the controller 22 does not execute humidification control.

According to the second embodiment, when the cooling medium temperature is low, rather than determining that the wet state exists uniformly, the judgment may be performed on the basis of the nearest measurement.

The present invention is not restricted to the embodiments, examples, and modifications described in the SPECIFICATIONS, and may be implemented in various configurations as long as the list of the invention is not lost. For example, the technical characteristics described in the embodiments, examples, and modifications corresponding to the technical characteristics in each form described in the SUMMARY column may be appropriately substituted or combined together in order to resolve some or all of the above-described issues, or to realize some or all of the above-described effects. Moreover, if the technical characteristics are not described as compulsory in the SPECIFICATIONS, they may be deleted appropriately. For example, the following is illustrated.

If the cooling medium temperature is equal to or above the predetermined temperature, it may be assumed that the electrolyte membrane is wet. That is, if the cooling medium temperature is equal to or above the predetermined temperature, the other steps (for example, step S335) need not be executed.

Even if the temperature of the fuel cell is below the predetermined temperature, the real part may be measured as long as humidification is prohibited.

A parameter other than temperature may also be used as the condition for stopping dryness detection of the electrolyte membrane (the condition for detecting the existence of the second operation state). For example, the water balance, gas diffusion resistance, condensed moisture content, stoichiometric ratio of the anode gas or cathode gas, or the imaginary part of impedance may be measured and dryness detection of the electrolyte membrane may be stopped if the condition of misdetection tends to occur, or any one or a combination of these conditions may also be used. If conditions are combined together, the AND condition or OR condition may be used appropriately. The measurement of water balance and the measurement of the condensed moisture content may be performed by measuring the amount of water generated in the fuel cell, the water content flowing out from the fuel cell, the water content flowing into the fuel cell, and the temperature of the fuel cell, for example.

The second operation state may be considered as an operation state with a high water balance, or an operation state in which the temperature of the fuel cell is higher than a predetermined temperature, or an operation state in which the gas diffusion resistance is high, or else, an operation state in which the condensed moisture content is high.

The dryness control process may also be ended immediately after dryness detection of the electrolyte membrane is stopped. That is, if NO is determined in step S310 of the first embodiment, the real part of impedance may not be considered as a predetermined value, and the same result as in the first embodiment may be obtained if humidification control is stopped.

If a humidifier for humidifying the cathode gas is provided, the above-described humidification control may be performed by the humidifier.

The frequency used for impedance measurement may not necessarily be a fixed value. That is, a single frequency may be used for a single measurement, and a different frequency may be used each time measurement is performed. Alternatively, several frequencies may be used for measurement.

The fuel cell for which measurements are performed need not necessarily be used for cars, and may be mounted on other transportation equipment (such as bicycles or trains), or may be installed on the floor.

In the above-described embodiment, at least some of the functions and processes implemented by software may be implemented by hardware. Also, at least some of the functions and processes implemented by hardware may be implemented by software. Various types of circuits, such as an integrated circuit, a discrete circuit, or a circuit module that is a combination of these circuits may be used as hardware.

What is claimed is:

1. A fuel cell system, comprising: a measurer configured to measure an impedance of the fuel cell using a single frequency; a controller programmed to control an operation state of the fuel cell; and an acquirer programmed to acquire a temperature of the fuel cell, wherein when the temperature of the fuel cell is equal to or above a predetermined value, the operation state is determined as a first operation state, and when the temperature is less than the predetermined value, the operation state is determined as a second operation state having a water balance higher than that of the first operation state, wherein the water balance indicates a water content in the fuel cell, acquire a dryness degree of the fuel cell from a real part of the measured impedance, when the real part of the measured impedance is smaller than a reference value, determine the dryness degree as a wet state, when the operation state is the first operation state, determine the dryness degree based on the real part of the measured impedance, and when the operation state is the second operation state, acquire the dryness degree of the fuel cell as a wet state, wherein when it is acquired, by the acquirer, that the dryness degree is a dry state, the controller controls humidification of the fuel cell such that the water balance is more than that of the first operation state.

2. The fuel cell system according to claim 1, wherein the acquirer is programmed to acquire the real part on the basis of measurement by the measurer when the operation state is the first operation state, and the real part is considered to be a value that is smaller than the reference value when the operation state is the second operation state.

3. A fuel cell system, comprising: a measurer configured to measure an impedance of the fuel cell using a single frequency; a controller programmed to control an operation state of the fuel cell; an acquirer programmed to acquire a temperature of the fuel cell, wherein when the temperature of the fuel cell is equal to or above a predetermined value, the operation state is determined as a first operation state, and when the temperature is less than the predetermined value, the operation state is determined as a second operation state having a water balance higher than that of the first operation state, wherein the water balance indicates a water content in the fuel cell, acquire a dryness degree of the fuel cell from a real part of the measured impedance, when the real part of the measured impedance is smaller than a reference value, determine the dryness degree as a wet state, when the operation state is the first operation state, determine the dryness degree based on the real part of the measured impedance, and when the operation state is the second operation state, acquire the dryness degree of the fuel cell from the real part of the measured impedance measured by the measurer during the first operation state, wherein when it is acquired, by the acquirer, that the dryness degree is a dry state, the controller controls humidification of the fuel cell such that the water balance is more than that of the first operation state.

4. A method of acquiring a dryness degree of a fuel cell, the method comprising:
   acquiring a temperature of the fuel cell,
   determining, when the temperature of the fuel cell is equal to or above a predetermined value, an operation state of the fuel cell is a first operation state, and when the temperature is less than the predetermined value, the operation state is a second operation state having a water balance higher than that of the first operation state, wherein the water balance indicates a water content in the fuel cell;
   acquiring the dryness degree of the fuel cell from a real part of a measured value of an impedance of the fuel cell when the operation state of the fuel cell is the first operation state, wherein when the real part of the measured value of the impedance is smaller than a reference value, the dryness degree is determined as a wet state; and
   determining the dryness degree as a wet state when the operation state is the second operation state, wherein the impedance is measured using a single frequency, and when it is acquired that the dryness degree is a dry state, the fuel cell is humidified such that the water balance is more than that of the first operation state.

5. The method according to claim 4, wherein
the real part is acquired on the basis of the measured value when the operation state is the first operation state, and the real part is considered to be a value that is smaller than the reference value when the operation state is the second operation state.

* * * * *